United States Patent [19]

Chou

[11] 3,919,711

[45] Nov. 11, 1975

[54] ERASABLE FLOATING GATE DEVICE

[75] Inventor: Sunlin Chou, Santa Clara, Calif.

[73] Assignee: Intel Corporation, Santa Clara, Calif.

[22] Filed: Feb. 26, 1973

[21] Appl. No.: 335,519

[52] U.S. Cl. .................................... 357/23; 317/235

[51] Int. Cl.$^2$ ........................................... H01L 29/78

[58] Field of Search .................... 317/235 B; 357/23

[56] References Cited

UNITED STATES PATENTS 3,774,087 11/1973 Pepper ................................ 317/235

FOREIGN PATENTS OR APPLICATIONS 2,201,028 8/1972 Germany ........................... 317/235

*Primary Examiner*—Martin H. Edlow

[57] ABSTRACT

A metal-oxide-semiconductor (MOS) floating gate storage device is disclosed which includes a pair of spaced-apart regions (source and drain) disposed in a substrate below a floating gate which is completely surrounded by silicon oxide. The gate extends laterally to a third diffused region in the substrate. The floating gate which provides non-volatile storage for an electric charge is charged through avalanche injection and electrically discharged through the third region.

14 Claims, 4 Drawing Figures

ERASABLE FLOATING GATE DEVICE

BACKGROUND OF THE INVENTION

1. Field of the Invention

The invention relates to the field of erasable floating gate devices.

2. Prior Art

The earliest disclosures of floating gate devices known to the applicant are those shown in U.S. Pat. No. 3,500,142 (Khang) and Canadian Pat. No. 813,537 (Scott). Both of these patents disclose memory devices wherein electrical charge is stored on a floating gate or in a silicon nitride layer. Apparently, in the devices disclosed in these patents, charge is transported onto the floating gate through tunneling and there is a suggestion in U.S. Pat. No. 3,500,142 that the trapped charge may be removed by subjecting the device to radiation. A number of problems exist with the devices disclosed in these patents including the fact that a very thin gate insulation is required, making them difficult selective fabricate, and also an additional gate is required in order to charge the floating gate, this additional gate adds to the complexity of these devices.

In U.S. Pat. No. 3,660,819 an MOS floating gate device is disclosed which utilizes avalanche injection for charging a floating gate. In this device a relatively thick oxide layer (500 A or greater) is utilized between the substrate and the floating gate, making the device practical to fabricate when compared to the previously discussed devices. This patent also discusses the fact that the charge may be removed from the floating gate by subjecting the device to X-rays or to ultraviolet radiation.

In application, Ser. No. 106,643, filed Jan. 15, 1971 and assigned to the assignee of the present application, a floating gate device is disclosed wherein a gate or gates, in addition to the floating gate, are utilized to remove charge from the floating gate. One embodiment of such a device is illustrated in FIG. 1 and will be discussed in detail in conjunction with FIG. 1. One problem in the manufacturing of such devices is that the fabrication process involves a modification to the existing silicon gate processes. An extra masking step and oxidation step are required in order to form the additional metal gate utilized for removing the charge from the floating gate. As will be seen, the presently disclosed device is easier to fabricate than those devices that require an additional gate disposed above the floating gate.

SUMMARY OF THE INVENTION

An MOS erasable floating gate device which in the presently preferred embodiment is fabricated on an N-type silicon substrate is disclosed. The device includes a pair of spaced-apart $P^+$ regions forming the source and drain. A third $P^+$ diffused region spaced apart from the source and drain is utilized for discharging the floating gate. A floating gate is disposed above the channel defined by the source and drain regions and extends laterally to the third region. In the presently preferred embodiment the oxide insulating the floating gate from the substrate is between 300–600A. The floating gate is charged by avalanche injection, when avalanching is induced in the junctions defined by the source of drain regions and the substrate, and is discharged through the third region.

DETAILED DESCRIPTION OF THE INVENTION

Figure 1:
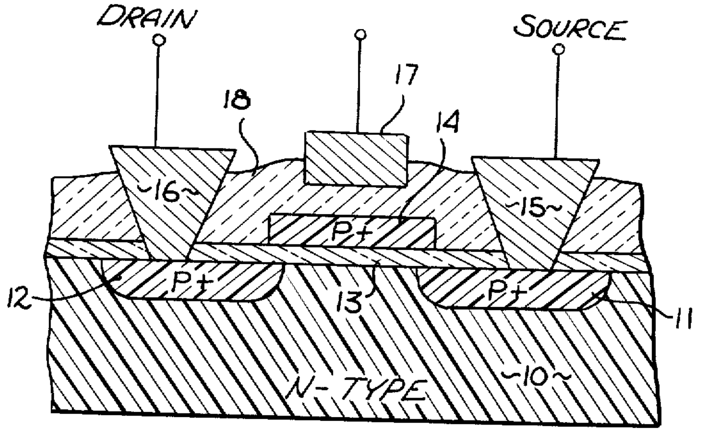
PRIOR ART FIG. 1
FIG. 1 is a cross-sectional view of a prior art floating gate device wherein an additional gate is utilized for discharging the floating gate.

Referring to FIG. 1, a prior art MOS storage device which includes floating gate 14 and a second gate 17 disposed above the floating gate is disclosed. The device is fabricated on an N-type silicon substrate 10 and includes a pair of spaced-apart $P^+$ regions 11 and 12 commonly referred to as the source and drain. The floating gate 14, which comprises a $P^+$ polycrystalline silicon is completely surrounded or buried in insulation which comprises tha gate insulation 13 and the field insulation 18. The insulation comprises silicon oxide (for example, $SiO_2$, SiO). Electrical contact is made to the region 12 via a metal contact 16 and to the region 11 via a metal contact 15. Where avalanche injection is utilized to transfer charge onto the floating gate 14 the insulation means 13 may be approximately 1,000 A thick or thicker. To place charge on the floating gate a negative voltage, for the P channel device illustrated, is applied between the source and drain of sufficient magnitude to cause an avalanche injection. Charge is removed from the device by the application of a voltage between the gate 17 and the source and drain regions as described in the application cited in the prior art section. One problem with the fabrication of such a device is that an extra masking step is required to define the area between the gate 17 and the floating gate 14. The insulating between these two gates is thinner than the field oxide generally utilized for MOS devices. In addition to this extra masking step, an additional oxidation step must be performed.

As will be seen, the present invention provides an electrical means for both charging and discharging the floating gate without the need for an additional gate such as gate 17 of FIG. 1, thus the device of the present invention may be much more readily fabricated utilizing existing silicon processes.

Figures 2, 3:
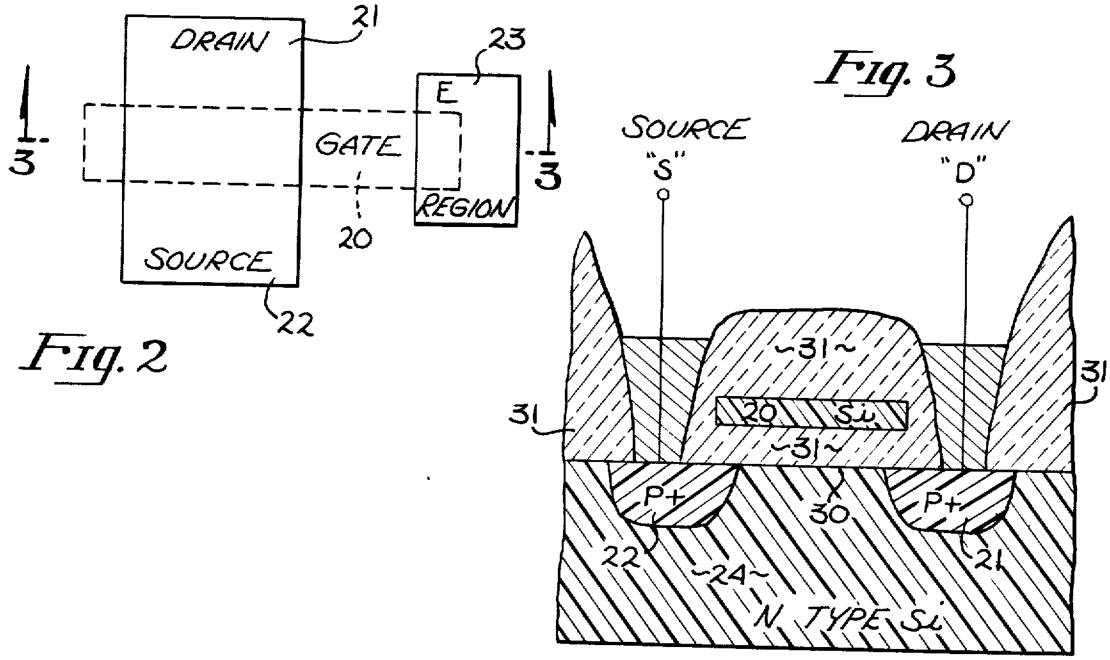
FIG. 2 is a plan view of the erasable floating gate device built in accordance with the present invention.
FIG. 3 is a cross-sectional view of the device of FIG. 2 taken through the source and drain regions.

Referring to FIGS. 2 and 3, the device of the present invention in its presently preferred embodiment is fabricated on a substrate 24 and includes a first and second spaced-apart regions 21 and 22 referred to as the drain and source regions. These spaced-apart regions define a channel 30 illustrated in FIG. 3. The source and drain region are of opposite conductivity type to the substrate 24 and in the presently preferred embodiment an N-type silicon substrate is utilized with a $P^+$ source and drain regions.

A third region referred to as the E region 23, is also disposed in the substrate and spaced apart from both the source and drain regions and the channel defined by these regions. Region 23 is of the same conductivity type and in the source and drain region in the presently preferred embodiment is a $P^+$ diffused region.

A floating gate 20 is disposed above the channel 30 and extends laterally to the edge of the E region 23. This floating gate is completely surrounded by insulation 31 and hence no conducting path exists to the floating gate 20. In the presently preferred embodiment the floating gate comprises a $P^+$ polycrystalline silicon.

In the fabrication of the device a single diffusion step is utilized, after the gate 20 has been formed. Thus the E region (as well as the source and drain) are aligned with the gate 20. During this diffusion the gate is likewise doped. The E region, when charge exists on the floating gate 20, may extend under the gate 20 because of the inversion layer caused by the charge on the gate 20 near the E region.

In the presently preferred embodiment the gate 20 is separated from the substrate by a uniform oxide insulation of between 300–600 A.

The device of FIGS. 2 and 3 may be fabricated utilizing known MOS silicon gate technology. This technology is discussed in numerous prior art publications, including the *IEEE Spectrum*, Volume 6, No. 10, October 1969, "Silicon Gate Technology," page 28, by Vadasz, Grove, Rowe and Moore. As is commonly done with such devices, metal contacts are disposed in openings etched through the silicon oxide layers to underlying regions. In the device of FIGS. 2 and 3 contacts are made to the source and drain region and to the E region 23. As previously mentioned, no contact is made to the floating gate 20.

In order to place a charge on the floating gate 20 a negative voltage for the P channel device illustrated is applied between the source and drain terminals of the device. The magnitude of this voltage should be large enough to cause an avalanche breakdown and in the presently preferred embodiment a voltage of approximately 40 volts is sufficient. As a result of the avalanche breakdown "hot" electrons are injected through the thermal oxide onto the floating gate, charging the floating gate. The phenomenon of this avalanche injection, in addition to being described in some of the above mentioned patents, is also discussed in an article entitled "Memory Behavior in a Floating Gate Avalanche Injection MOS (FAMOS) Structure," Applied Physics Letter 18, pages 332–334 (1971) by D. Frohman-Bentchkowsky. Alternatively, the floating gate may be charged by placing a negative voltage on the E region while the source and drain are grounded.

To discharge the floating gate, the E region 23 is grounded and the source and drain of the device are simultaneously raised to a negative potential. It may be possible in some embodiments to leave either the source or drain floating and to apply the negative voltage to the other regions. If an N channel device is utilized a positive potential would be utilized for the removal of the charge from the device. The removal of the charge from the floating gate is believed to be caused by avalanche injection of "hot" electrons from the gate into the E region 23 and/or by Fowler-Nordhein emission of electrons through the silicon oxide.

Figure 4:
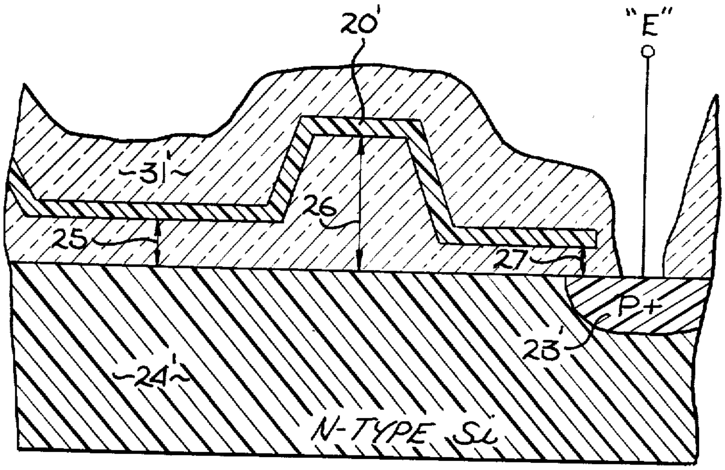
FIG. 4 is a cross-sectional view of an alternate embodiment of the device of FIGS. 2 and 3, this view is taken through section line 3—3.

In order for the charge to be removed from the floating gate it is necessary that a high electric field be developed between the floating gate and the E region 23. This high electric field in the presently preferred embodiment is produced by using an insulation between the substrate and floating gate of between 300–600 A. In FIG. 4 an alternate embodiment which achieves this high electric field by using differnet insulation thickness is shown. In the embodiment of FIG. 4 the high electric field is produced by having less capacitance between the floating gate and the E region 23 than between the floating gate and the source and drain regions. Assume that the voltage $V_E$ is the negative potential between the source and drain regions of the E region when it is desired to erase the floating gate, that is to remove the charge from the floating gate. Additionally assume that $V_{GO}$ is the voltage on the floating gate due to the charge on the floating gate, this voltage being with respect to the source and drain. It may be readily seen that the voltage creating the field between the floating gate and the E region, $V_{GE}$ is:

$$V_{GE} \cong V_{GO} + \beta V_E$$

where $$\beta = \frac{C_{SDG}}{C_{SDG} + C'_G}$$

Note that $C_{SDG}$ is the capacitance between the source and drain regions and the gate and $C'_G$ is the capacitance between the gate and the other regions in the substrate including the E region. It is desirable to have $\beta$ equal to approximately 0.5 or greater in order to be able to remove charge from the floating gate with voltages of the same order of magnitude as is required for charging the floating gate.

The device of FIG. 4 is similar to the device of FIGS. 2 and 3 except that the oxide thickness between the channel defined by the source and drain and the gate is different than the oxide thickness between the E region and the gate. In FIG. 4 the corresponsing numbers to FIGS. 2 and 3 have been marked with primes. (Note that in FIG. 4 because of the direction of that view the source and drain regions as not illustrated.) The device of FIG. 4 includes a source, drain and E region similar to the device of FIGS. 2 and 3.

In the alternate embodiment of FIG. 4 the above mentioned capacitances are achieved with an oxide thickness between the channel defined by the source and drain and the floating gate 20' (dimension 25 of FIG. 4) of approximately 1,000 A or thicker. The oxide thickness between the floating gate and the E region 23' (shown as dimension 27 in FIG. 4) is between 200–500 A thick. In other respects the device of FIG. 4 may be programmed and erased in the same manner as the device of FIGS. 2 and 3. (Note that in the embodiment of FIG. 4 an additional masking step is required when compared to the embodiment of FIGS. 2 and 3.)

In order to assist the erasing of the floating gate, it may be desirable in some embodiments for the potential applied to the source and drain to be in the form of a pulse having a very short rise time. This will cause a state of deep depletion in the silicon gate overlapping the E region 23.

In some embodiments of the present invention a problem may be caused by parasitic channeling by the channel defined by the source and drain region and the E region 23'. This potential problem may be minimized by increasing the thickness of the insulation between the floating gate and the region of the substrate between the channel and the E region 23'. This is shown in FIG. 4 by dimension 26. The floating gate 20' is separated from the substrate by approximately 1 to 2 microns of insulation in this region, hence the charge on the floating gate would be further from the parasitic channel minimizing the parasitic channeling.

The invented device may be used as a storage device and provides non-volatile storage since once a charge is placed on the floating gate the charge will remain on the gate, under normal conditions, for many years. The device operates in a manner similar to an enhancement-mode MOS transistor, therefore no conduction exists between the source and drain when the floating gate is uncharged; and conduction occurs between the source and drain when a charge exists on the floating gate. such devices may be utilized in read-only memories and other types of semiconductor memories. For examples of circuitry, see applications entitled "Electrical Programmable Read Only Memory Array," Ser. No. 146,358 filed May 24, 1971 and "Random-Access Floating Gate MOS Memory Array," Ser. No. 186,955 filed Oct. 6, 1971, both of these applications being assigned to the same assignee as the present application.

Thus, an electrically erasable MOS floating gate device has been disclosed which does not require in the presently preferred embodiment, the additional processing steps required in the prior art devices to form the second gate utilized in prior art devices for erasing. The third region or E region utilized for erasing may be formed during the same diffusion step utilized to form the source and drain regions. The device may be fabricated utilizing known MOS technology.

I claim:

1. A semiconductor storage device comprising:
a substrate of a first conductivity type;
a first and second spaced-apart region in said substrate of a second conductivity type to said first conductivity type, said regions defining a channel;
a third region in said substrate of said second conductivity type spaced apart from said channel;
a floating gate disposed above said channel and extending at least to said third region;
insulation means, insulating said floating gate from said substrate and surrounding said floating gate; and
contact means, coupled to said third region for permitting the application of an electrical signal to said region;
whereby charge may be transferred onto said floating gate by avalanche injection from said substrate and removed from said floating gate through said third region.

2. The device defined by claim 1 wherein said substrate comprises an N-type silicon.

3. The device defined by claim 2 wherein said floating gate comprises silicon.

4. The device defined by claim 2, wherein said insulation between said substrate and said floating gate is between 300–600 A thick.

5. The device defined by claim 3 wherein said insluation means between said channel and said floating gate is thicker than said insulation means between said third region and said floating gate.

6. The device defined by claim 5 wherein said insulation means between said channel and said floating gate is approximately at least 1,000 A thick.

7. A semiconductor device comprising:
a substrate of a first conductivity type;
a first, second and third spaced-apart regions in said substrate of a second conductivity type, said first and second regions defining a channel;
a floating gate disposed above said channel and extending laterally to said third regions;
insulation means completely surrounding said floating gate; and
contact means coupled to said first, second and third spaced-apart regions for the slelctive application of signals to said regions;
whereby the application of a voltage between said first and second regions charge may be transferred by avalanche injection onto said floating gate and charge may be removed from said floating gate by the application of a voltage between at least one of said first and second regions and said third regions.

8. the device defined by claim 7 wherein said substrate comprises N-type silicon and said floating gate comprises a P-type silicon.

9. The device defined by claim 8 wherein the quantity $\beta$ is equal to or greater than approximately 0.5 where $$\beta = \frac{C_{SDG}}{C_{SDG} + C'_G}$$

where $C_{SDG}$ is the capacitance between said floating gate and said first and second regions and $C'_G$ is the capacitance between said floating gate and said substrate and third region.

10. A semiconductor storage device comprising:
an N-type silicon substrate;
a P-type spaced-apart source and drain regions disposed in said substrate, said source and drain regions defining a channel;
a third P-type region disposed in said substrate and spaced apart from said channel;
a P-type polycrystalline silicon gate disposed above said channel and extending to said third P-type region;
a first silicon oxide insulative means separating said channel from said floating gate;
a second silicon oxide insulation means separating said third P-type region from said floating gate; and
contact means coupled to said third region for applying an electrical signal to said third region;
whereby charge may be transferred and removed from said floating gate by the application of voltages between said first, second and third regions.

11. The device defined in claim 10 wherein said first insulation means is thicker than said second insulation means.

12. The device defined in claim 11 wherein said first insulative means is approximately at least 1,000 A thick and said second insulation means is approximately between 200–500 A thick.

13. The device defined in claim 11 including third insulation means between said floating gate and the region of said substrate between said channel and said third region and wherein said third insulation means is thicker than said first insulation means.

14. The device defined in claim 13 wherein said third insulation means is at least 10,000 A thick.

* * * * *